US005523980A

United States Patent [19]

Sakui et al.

[11] Patent Number: 5,523,980
[45] Date of Patent: Jun. 4, 1996

[54] SEMICONDUCTOR MEMORY DEVICE

[75] Inventors: Koji Sakui, Tokyo; Hiroshi Nakamura, Kawasaki; Tomoharu Tanaka, Yokohama; Masaki Momodomi, Yokohama; Fujio Masuoka, Yokohama; Kazunori Ohuchi, Yokohama; Tetsuo Endoh, Yokohama, all of Japan

[73] Assignee: Kabushiki Kaisha Toshiba, Kawasaki, Japan

[21] Appl. No.: 364,990

[22] Filed: Dec. 28, 1994

[30] Foreign Application Priority Data

Dec. 28, 1993 [JP] Japan ..................... 5-354215
Aug. 23, 1994 [JP] Japan ..................... 6-198841

[51] Int. Cl.$^6$ ..................................... G11C 8/00
[52] U.S. Cl. ................. 365/230.08; 365/230.03; 365/230.06
[58] Field of Search ............... 365/189.05, 230.03, 365/230.06, 230.08, 185, 238.5

[56] References Cited

U.S. PATENT DOCUMENTS

| | | | |
|---|---|---|---|
| 4,958,326 | 9/1990 | Sakurai | 365/230.03 |
| 5,034,928 | 7/1991 | Isobe | 365/230.03 |
| 5,043,942 | 8/1991 | Iwata et al. | 365/185 |
| 5,073,873 | 12/1991 | Nogami | 365/189.05 |

*Primary Examiner*—Joseph A. Popek
*Attorney, Agent, or Firm*—Oblon, Spivak, McClelland, Maier & Neustadt

[57] ABSTRACT

A NAND-cell type EEPROM having a plurality of bit lines, a plurality of control gate lines intersecting with the bit lines, and a plurality of memory cells driven by applying a potential to the control gate lines for selectively storing data, supplying data to the bit lines and receiving data therefrom. The memory cells form a plurality of cell units. The memory cells constituting each cell unit are connected in series to one bit line by a common selecting gate transistor. A plurality of data latch circuits are provided on the bit lines, respectively, for storing data to be written into the memory cells selected by the control gate lines. Further, a plurality of selecting gate drivers are provided to correspond to the cell units, respectively, for driving the control gate lines. A row decoder decodes row addresses for driving the selecting gate drivers and the control gate lines. A plurality of block-address latch circuits are provided to correspond to the selecting gate drivers, respectively, for temporarily storing signals derived from a row address by the row decoder, thereby to select at least two of the selecting gate drivers at the same time in order to write data.

10 Claims, 16 Drawing Sheets

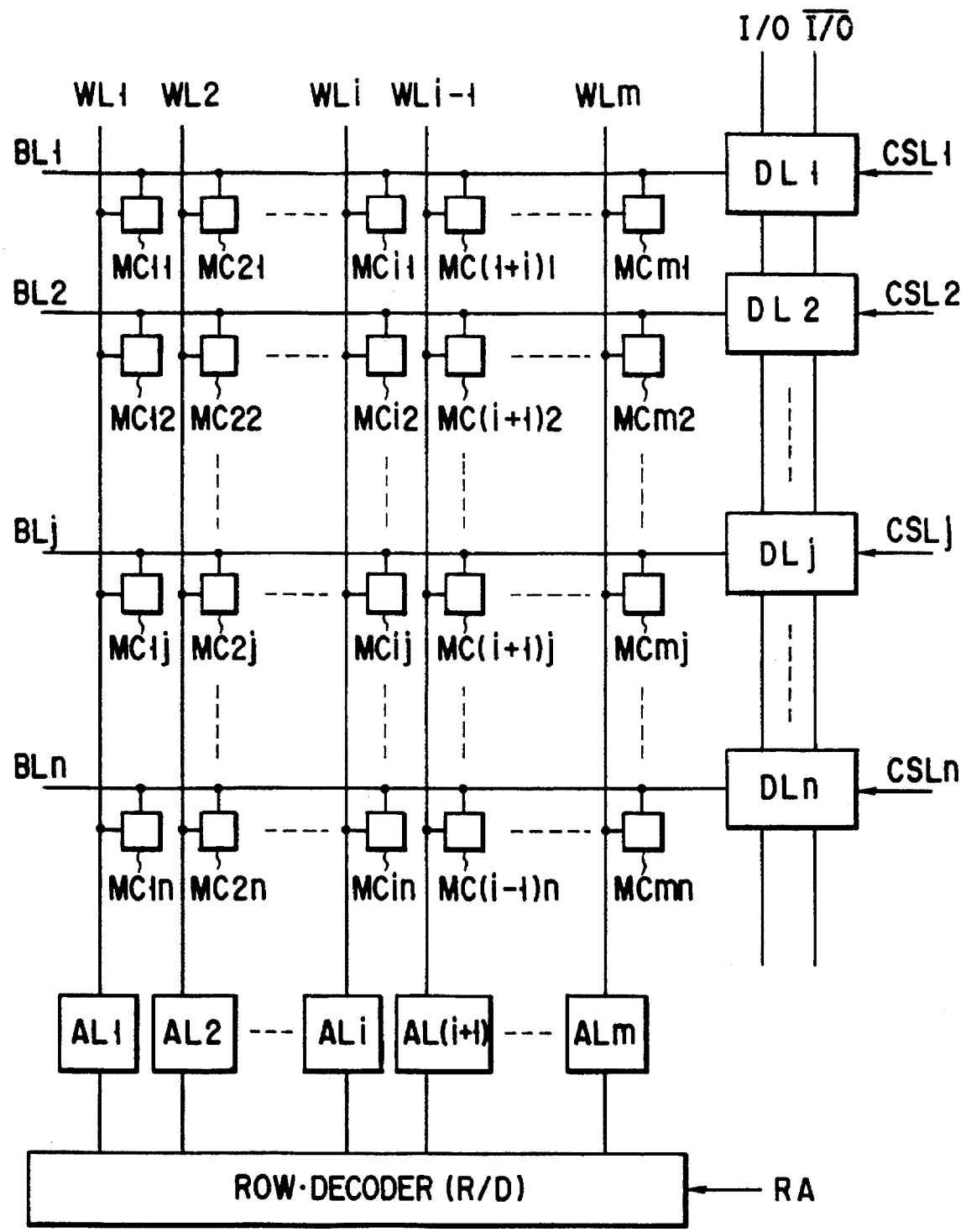
F I G. 1

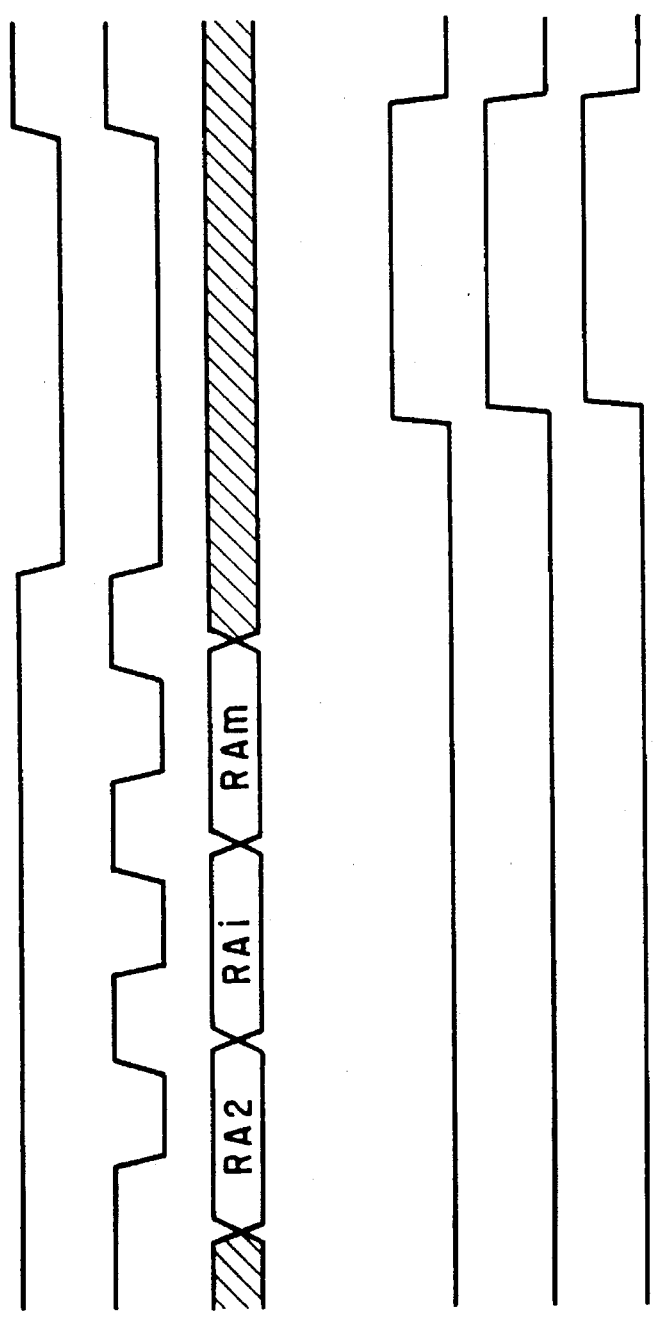
FIG. 2A ALE
FIG. 2B WE
FIG. 2C RA
FIG. 2D WL2
FIG. 2E WLi
FIG. 2F WLm

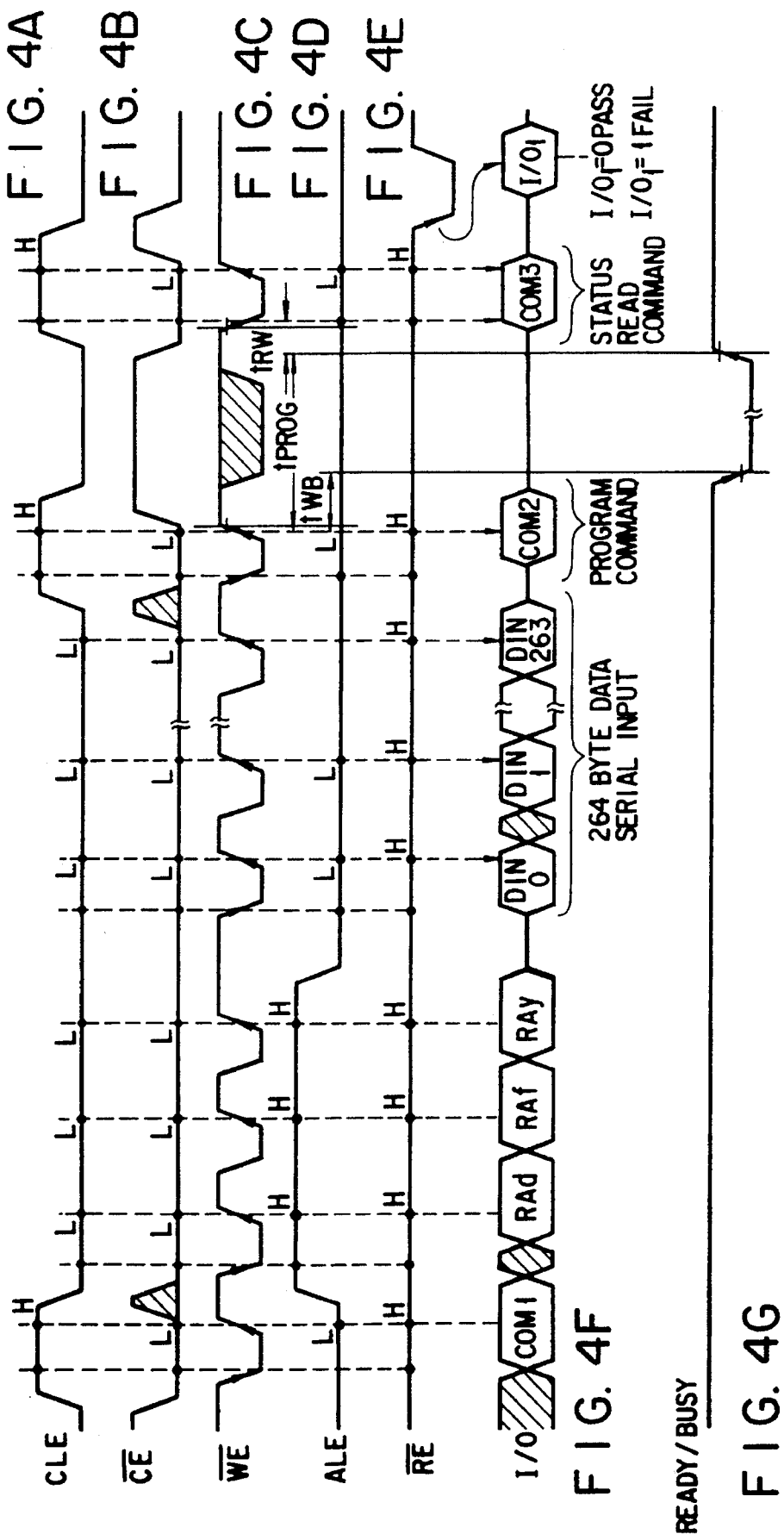

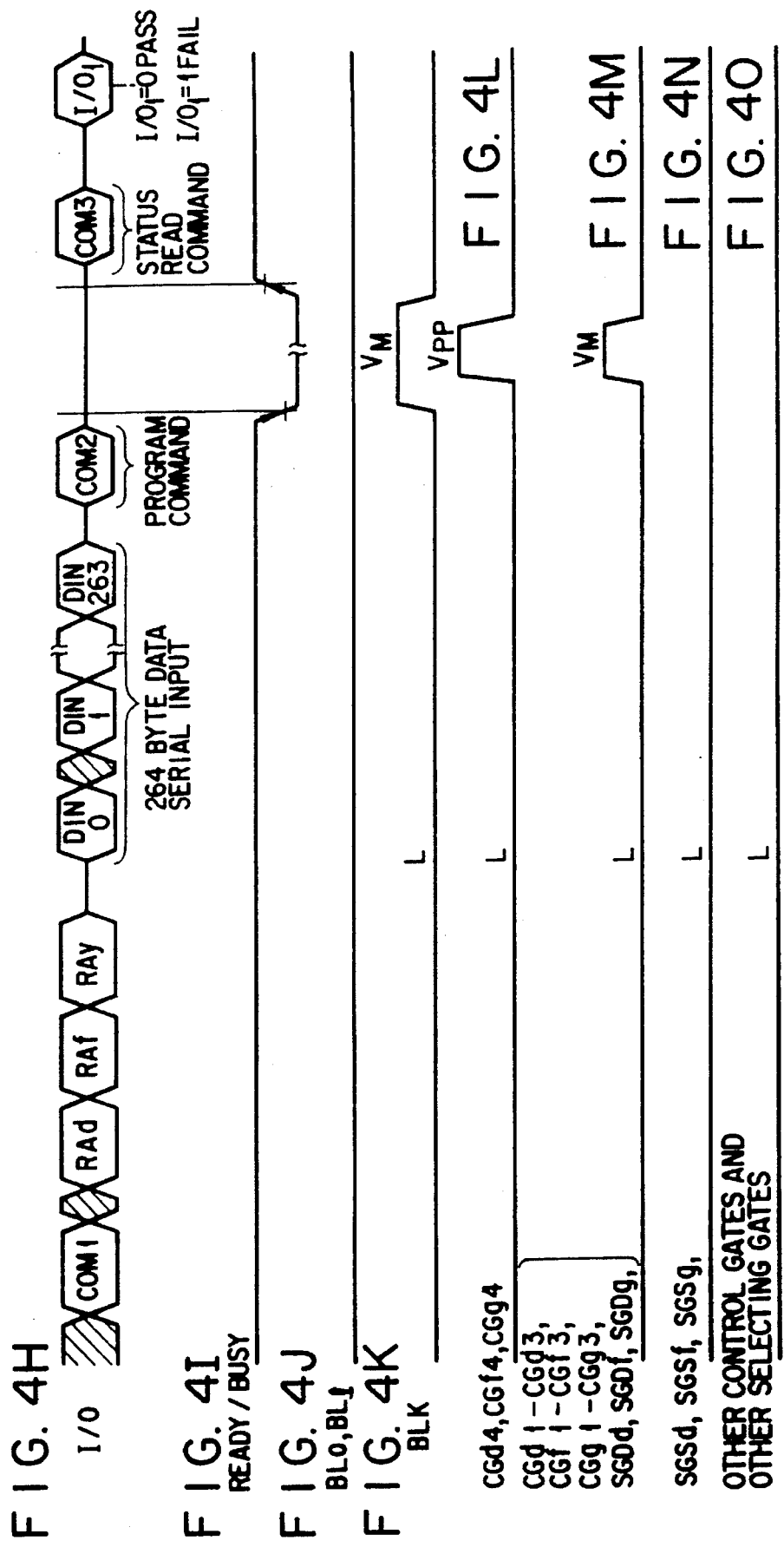

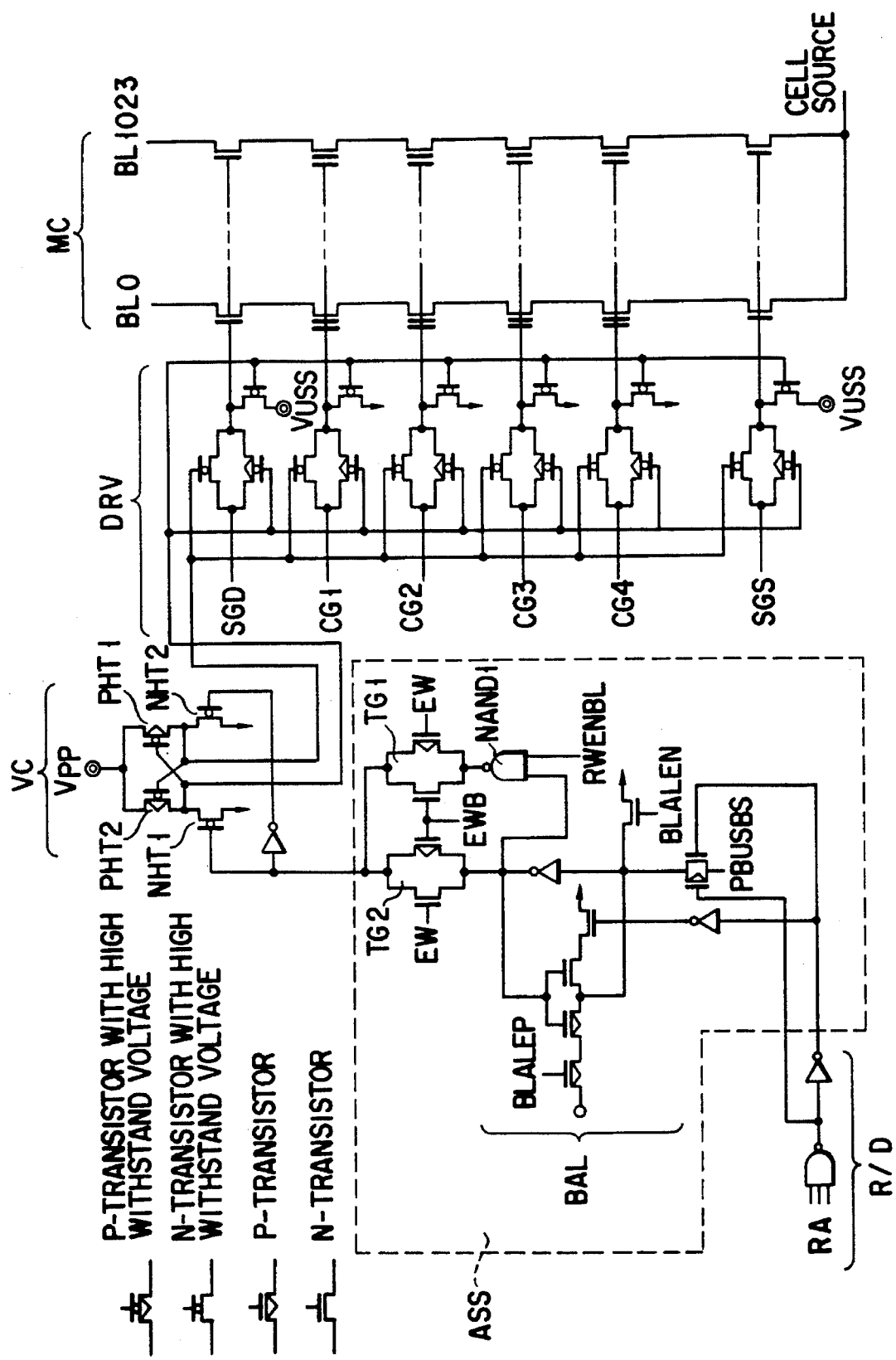
F I G. 5

FIG. 7A COM 11
FIG. 7B RWENBL
FIG. 7C EW
FIG. 7D EWB

FIG. 7E COM 12
FIG. 7F RWENBL
FIG. 7G EW
FIG. 7H EWB

FIG. 7I COM 13
FIG. 7J EENBL
FIG. 7K EW
FIG. 7L EWB

SEMICONDUCTOR MEMORY DEVICE

BACKGROUND OF THE INVENTION

1. Field of the Invention

The present invention relates to a semiconductor memory device, and more particularly to a semiconductor memory device in which the same data can be written into a plurality of sets of memory cells and at the same time.

2. Description of the Related Art

In recent years, electrically erasable programmable ROMs (EEPROMs), wherein data can be electrically written and erased, are used as memory devices in computer systems. Known as one type of an EEPROM is a so-called NAND-cell type EEPROM which excels in integration density. The NAND-cell type EEPROM comprises a plurality of memory-cell units. Each unit consists of a plurality of memory cells which are connected in series to have a source and a drain in common. The memory cells of one unit are connected to one bit line.

On the other hand, two types of EEPROMs having large storage capacity are know. The first type called "AND-type" is disclosed in H. Kume, et al. of Hitachi Seisakusho, *A 1.28 $\mu m^2$ Contactless Memory Cell Technology for a 3 V-Only 64 Mbit EEPROM,* 1992 IEDM (International Electron Device Meeting) Tech. Dig., pp. 991–993. The second type called "DINOR-type" is disclosed in H. Onoda, et al. of Mitsubishi Denki, *A Novel Cell Structure Suitable for a 3 Volt Operation, Sector Erase Flash Memory,* 1992 IEDM Tech. Dig., pp. 599–602.

Each of the AND-type EEPROM and the DINOR-type EEPROM comprise a plurality of memory-cell units, each formed of a plurality of memory cells connected in parallel. Each memory-cell unit is provided with only one or two selecting gates, thereby increasing the integration density of the EEPROM of either type.

Each of the memory cells incorporated in the AND-type or DINOR-type EEPROM is of FET-MOS structure in which a charge-accumulating layer (i.e., a floating gate) and a control gate are arranged one above the other. An array of the memory cells, made in the form of an integrated circuit, is provided on a p-type substrate, a p-type well formed in an n-type well which is in turn formed in a p-type substrate, or a p-type well formed in an n-type substrate.

In a NAND-type EEPROM, the drains of the memory cells are connected to bit lines by selecting gates. The sources of the memory cells are connected to source lines (i.e., reference-potential lines) by other selecting gates. The control gates of the memory cells are connected together, forming a word line which extends in a row direction.

In the field of NAND-cell type EEPROMs, a set of memory cells connected one and the same word line is called "one page," and a set of pages located between a set of drain-side selecting gates and a set of source-side selecting gates is called "NAND block" or simply "block." The data stored in one NAND block is the smallest unit of data which can be erased independently of any other data.

The operation of the NAND-cell type EEPROM will be explained, based on the assumption that the memory cell array of the EEPROM is provided, in the form of an integrated circuit, in a p-type well formed in an n-type substrate.

To erase a NAND data block stored in a selected block of memory cells, the control gates of these memory cells are set at a reference potential Vss, and a high voltage Vpp (e.g., 20 V) is applied to the p-type well and the n-type substrate. The floating gate of every memory cell of the selected block emits electrons into the substrate. As a result, the threshold voltage of every memory cell decreases, and the memory cell comes to assume a specific state which will be referred to as "1" state. To erase all data stored in the memory as a whole, it suffices to select all NAND-cell blocks of the memory.

To write data into a selected NAND-cell block, a voltage is sequentially applied to the memory cells—first to the cell remotest from the bit line, and last to the cell closest to the bit line. To state more precisely, a high voltage Vpp (e.g., 20 V) is applied to the control gate of any memory cell selected in the NAND cell block, and an intermediate voltage Vm (e.g., 10 V) is applied to the control gate of any memory cell not selected in the NAND block. Either the reference potential Vss or the intermediate voltage Vm is applied to the bit line. Which voltage, Vss or Vm, should be applied to the bit line depends on the data to be written. If the reference potential Vss is applied to the bit line, it is eventually transferred to any selected memory cell. Electrons are thereby injected into the floating gate of the selected memory cell. As a result, the threshold voltage of the cell increases, and the memory cell comes to assume a specific state which will be referred to as "0" state. If the intermediate voltage Vm is applied to the bit line, no electrons are injected into each memory cell connected to the bit line. In this case, the threshold voltage of the cell does not change, remaining at a negative value.

In the data-writing mode, when a control gate line is selected, one-page data (e.g., data of 256 bytes) stored in data latch circuits can be stored altogether into the memory cells which are connected to the control gate line selected.

To the user of the NAND-cell type EEPROM, it is desirable, to facilitate the management of data stored in the EEPROM, that one-page data be copied onto a plurality of control gate lines. In other words, the technique which can be called "multiplex selection and copy" is very important to the user. This is because particular data blocks are frequently moved within the memory cell array, thus rearranging them therein.

With the conventional NAND-cell type EEPROM, however, one-page data stored in the data latch circuits can be written only into those memory cells which are connected to a control gate line in a single data-writing process. Consequently, the data-writing process must be repeated in order to the same one-page data into two or more sets of memory cells.

A memory having a great storage capacity, the NAND-cell type EEPROM is subjected to a performance test by a manufacturer before it is shipped, or by a user after it is shipped. In the test, data items representing various patterns are written into the EEPROM, read from it and erased in it, many times, to determine whether or not the EEPROM operates well. Of the test data items, the most frequently used is one representing a continuous pattern such as checkerboard pattern. Hitherto, such a test data item is written into all sets of memory cells, one set after another. Inevitably it takes much time to determine whether or not the memory cells connected to each control gate line perform their function. The greater the storage capacity of the NAND-cell type EEPROM, the longer the test time and, hence, the higher the cost of the test.

This problem is inherent not only in the NAND-cell type EEPROM, but also in other large-capacity memories such as the AND-cell type EEPROM and the DINOR-cell type EEPROM.

As described above, with a conventional semiconductor memory having a large storage capacity, particularly a large-capacity flash memory, a data-writing process must be repeated to write the same one-page data into all sets of memory cells, one set after another, for the purpose of achieving management of stored data items or accomplishing performance test. As a consequence, a considerably long time is required for the management of data or the performance test.

SUMMARY OF THE INVENTION

In view of the foregoing the present invention has been made, and its object is to provide a semiconductor memory device in which the same data can be written into a plurality of sets of memory cells at the same time.

According to a first aspect of the invention, there is provided a semiconductor memory device comprising: a plurality of bit lines; a plurality of word lines intersecting with the bit lines; a plurality of memory cells driven by applying a potential to the word lines for selectively storing data, supplying data to the bit lines and receiving data therefrom; a plurality of data latch circuits provided on the bit lines, respectively, for storing data to be written into the memory cells selected by the word lines; a row decoder for decoding row addresses for driving the word lines; and a plurality of address-latch/word-line driver circuits provided on the word lines, respectively, for temporarily storing signals derived from a row address by the row decoder, thereby to select at least two of the word lines at the same time in order to write data.

According to a second aspect of this invention, there is provided a semiconductor memory device comprising: a plurality of bit lines; a plurality of control gate lines intersecting with the bit lines; a plurality of memory cells driven by applying a potential to the control gate lines for selectively storing data, supplying data to the bit lines and receiving data therefrom, the memory cells forming a plurality of cell units each comprising a plurality of memory cells selected from the memory cells and connected to one bit line via a common selecting gate transistor; a plurality of data latch circuits provided on the bit lines, respectively, for storing data to be written into the memory cells selected by the control gate lines; a plurality of selecting gate drivers provided to correspond to the cell units, respectively, for driving the control gate lines of the memory cells of each cell unit; a row decoder for decoding row addresses for driving the selecting gate drivers and the control gate lines; and a plurality of block-address latch circuits provided to correspond to the selecting gate drivers, respectively, for temporarily storing signals derived from a row address by the row decoder, thereby to select at least two of the selecting gate drivers at the same time in order to write data.

In the present invention, the address latch circuits (or block-address latch circuits) connected to the row decoder, the delta latch circuits connected to the bit lines for storing one-page data, and the peripheral circuits for controlling the address latch circuits and the data latch circuits cooperate to select at least two of the word lines (or control gate lines) at the same time. The same one-page data is thereby simultaneously copied into the memory cells connected to any word line (or control gate line) selected. It is therefore possible to copy and move data in the array of the memory cells within a short period of time, facilitating the data management in the memory cell array. Hence, test data representing a continuous pattern can be fast written into the memory cell array, thereby to accomplish a performance test on the cell array. The cost of the performance test can be reduced, and ultimately the bit cost of the memory device can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the memory cell array and peripheral circuits, all incorporated in a semiconductor memory device according to the first embodiment of the present invention;

FIG. 2 is a timing chart illustrating the waveforms of the signals which are used to write data into the memory device by means of multiplex word-line selection;

FIGS. 4A to 4D are timing charts depicting the waveforms of the signals which are used to write data into the memory device by means of multiplex control-gate-line selection;

FIG. 5 is a circuit diagram illustrating the row system used in the core section of the NAND-cell type EEPROM shown in FIGS. 3A and 3B;

FIGS. 7A to 7L are timing charts respectively explaining how the magnitudes of signals change to write, read and erase data in relation to the NAND-cell type EEPROM shown in FIGS. 3A and 3B;

DETAILED DESCRIPTION OF THE PREFERRED EMBODIMENTS

Figure 3A:
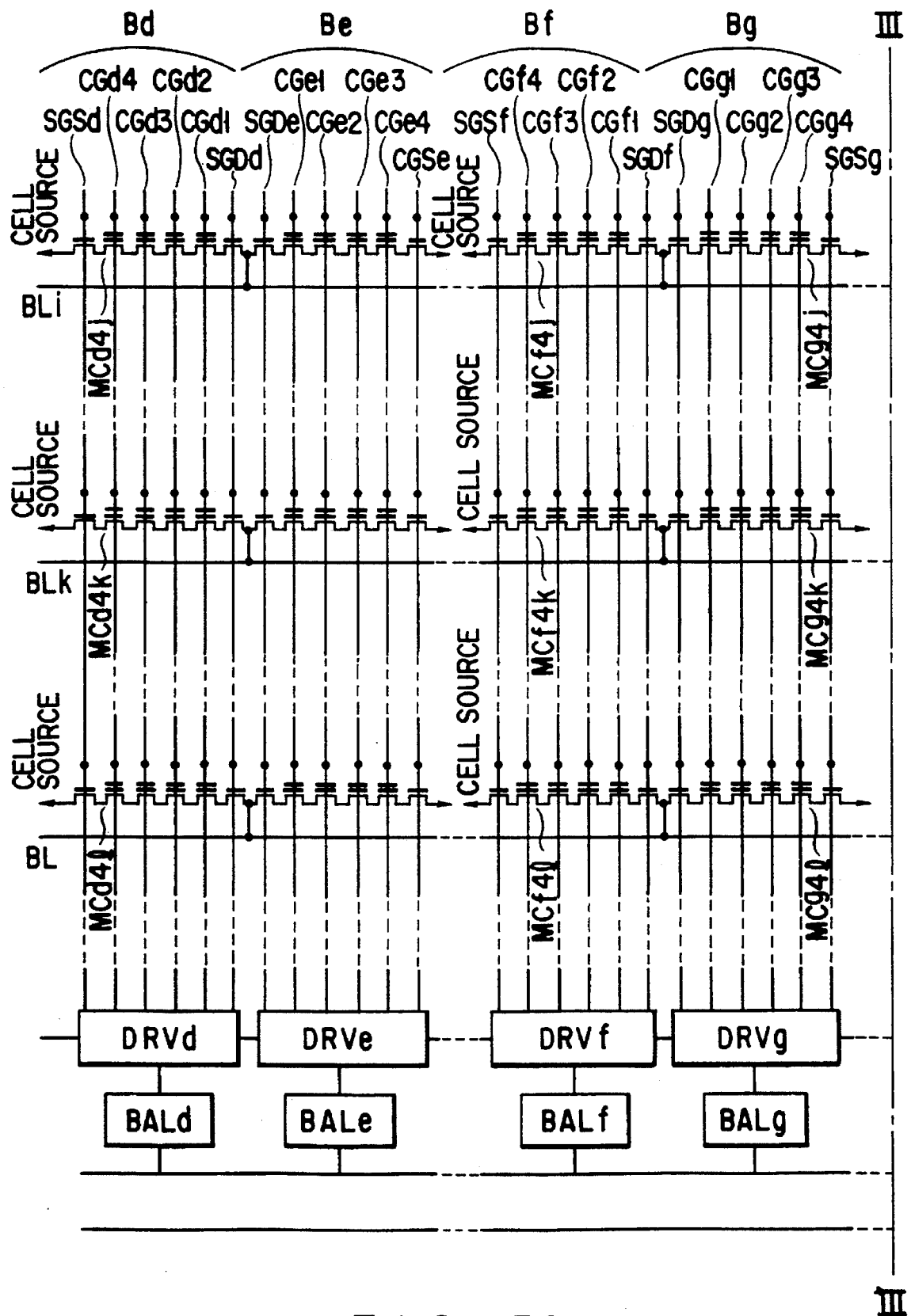
FIGS. 3A and 3B are a block diagram showing the memory cell array and peripheral circuits, all incorporated in a NAND-cell type EEPROM according to the second embodiment of the present invention.

Embodiments of the present invention will now be described, with reference to the accompanying drawings.

FIG. 1 is a block diagram showing the memory cell array and peripheral circuits, all incorporated in a semiconductor memory device according to the first embodiment of the invention.

As shown in FIG. 1, a plurality of bit lines BL (BL1, BL2, ..., BLj, ... BLn) extend parallel to one another, and a plurality of word lines WL (WL1, WL2, ..., WLi, WLi+1, ..., WLm) extend parallel to one another and at right angles to the bit lines BL. At the intersections of the bit lines BL and the word lines WL there are located a plurality of rewritable memory cells MC (MC11, MC12, ..., MCnm). Data latch circuits DL (DL1, DL2, ..., DLj, ..., DLn) are connected to the bit lines BL, respectively. Address latch/word-line driver circuits AL (AL1, AL2, ..., ALi, ALi+1, ..., ALm) are connected to the word lines WL, respectively. A row decoder R/D is connected to the address latch/word-line driver circuits AL, for selecting at least one of the driver circuits AL in accordance with row addresses RA. Column selecting lines CSL (CSL1, SCL2, ..., CSLj, ..., CSLn) are connected to the data latch circuits DL, respectively. The data latch circuits DL are connected in series by two input/output lines I/O and $\overline{I/O}$.

The semiconductor memory device shown in FIG. 1 is operated in the same way as the conventional one to achieve ordinary data-writing. Thus, how to perform the ordinary data-writing will not be described. Instead, special data-writing, wherein one-page data is copied onto a plurality of word lines at the same time, will be described with reference to FIG. 2. FIG. 2 is a timing chart depicting the waveforms of the signals which are used to write data into the memory device by means of multiplex word-line selection.

First, row addresses RA are input to the semiconductor memory device (i.e., a memory chip) to effect multiplex word-line selection. The row decoder circuit R/D receives the row addresses RA and sequentially supplies them to the address latch/word-line driver circuits AL. The row addresses RA are thereby stored into the driver circuits AL, respectively. Thereafter, to write data into the memory device, some of the word lines WL are selected in accordance with the row addresses stored in the address latch/word-line driver circuits AL. Assume that three row addresses RA2, RAi and RAm have been stored via the row decoder circuit R/D into the address latch/word-line driver circuits AL2, ALi and ALm, respectively, as illustrated in FIG. 2. Then, the three word lines WL2, WLi and WLm are selected at the same time.

Either before or after the word lines WL2, WLi and WLm are selected, data is input to the data latch circuits DL1 to DLn through the input/output lines I/O and $\overline{I/O}$. The data items stored in the data latch circuits DL1 to DLn are transferred to the bit lines BL1 to BLn. Hence, the data items on the word lines BL1 to BLn are simultaneously stored into the memory cells CM21 to MC2n, the memory cells Mci1 to MCin, and the memory cells MCm1 to MCmn.

Not only can the data items input to the latch circuits DL1 to DLn via the input/output lines I/O and $\overline{I/O}$ be simultaneously stored in the memory cells CM. But also can the data read from the memory cells MC and stored into the latch circuits DL1 to DLn be stored back into the memory cells MC at the same time. Assume that the word line WL1 is selected during a data-reading cycle. In this case, the data items stored in the memory cells MC11 to MC1n are read onto the bit lines BL1 to BLn and subsequently stored into the data latch circuits DL1 to DLn, respectively. When the word lines WL2, WLi and WLm are selected during a data-writing cycle, the data items stored in the data latch circuits DL1 to DLn are simultaneously stored into the memory cells MC21 to MC2n, the memory cells MCi1 to MCin and the memory cells MCm1 to MCmn. To state it another way, one-page data to be selected by energizing the word line WL1, if stored in the data latch circuits DL1 to DLn, is simultaneously copied into the memory cells MC21 to MC2n, the memory cells MCi1 to MCin and the memory cells MCm1 to MCmn when when the word lines WL2, WLi and WLm, for example, are selected at the same time during a data-writing cycle.

This technique of simultaneously writing identical data items into groups of memory cells can be applied to any memory that has rewritable memory cells. More precisely, the present invention is applicable to DRAMs (Dynamic Random-Access Memories), SRAMs (Static Random-Access Memories), and non-volatile memories such as EEPROMs.

As described above, the semiconductor memory device according to this invention can accomplish multiplex word-line selection. Therefore, one-page data can be simultaneously copied onto a plurality of word lines selected. As a result, the one-page data be copied faster than in the conventional semiconductor memory.

Figure 3B:
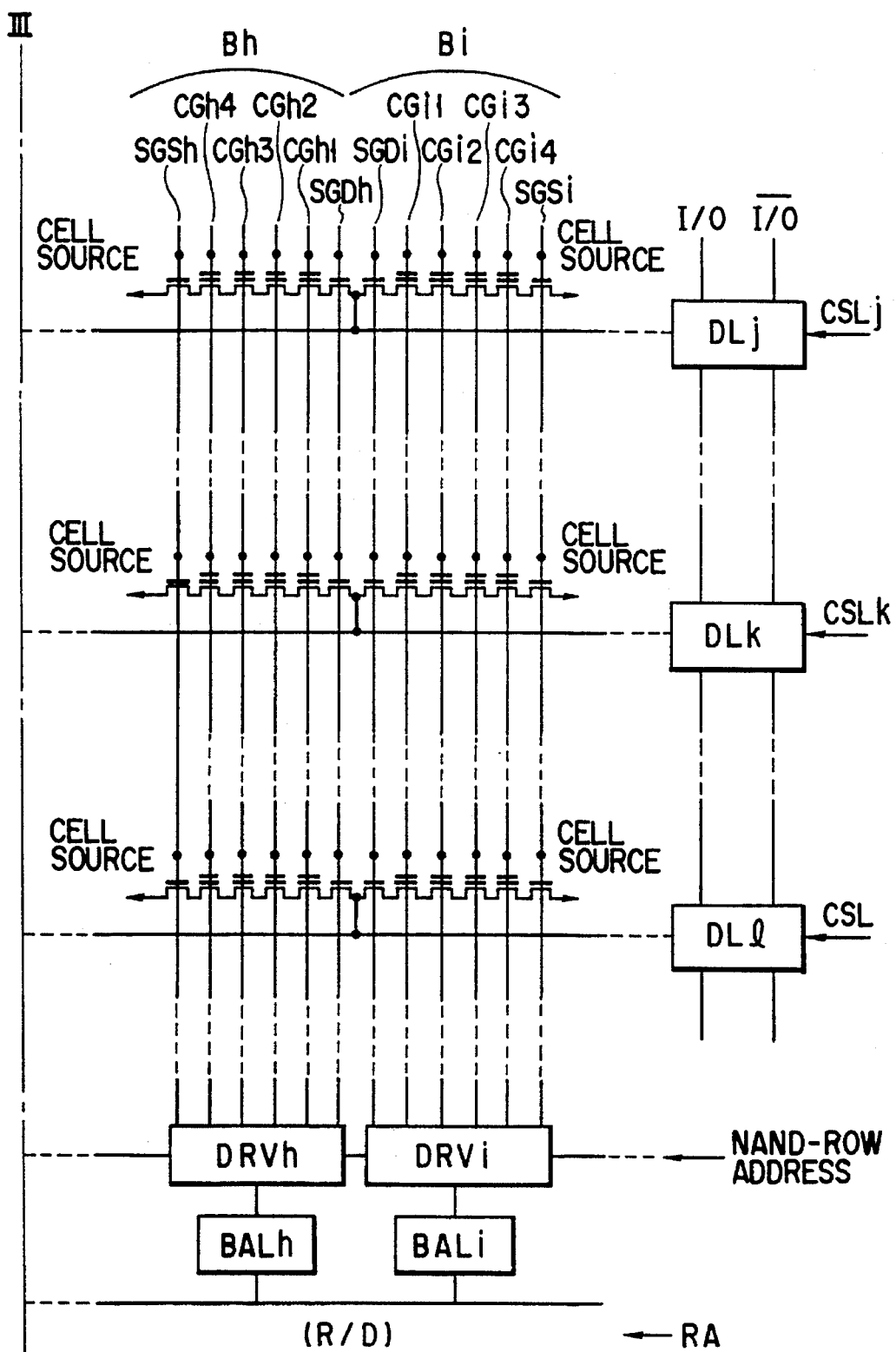

A NAND-cell type EEPROM, to which the invention is applied or which is the second embodiment of the invention, will be described in detail, with reference to FIGS. 3A and 3B. FIGS. 3A and 3B are a block diagram showing the memory cell array and peripheral circuits of the NAND-cell type EEPROM.

As shown in FIGS. 3A and 3B, the NAND-cell type EEPROM comprises control gate lines CG (CGd1–CGG4, CGe1–CGe4, CGf1–CGf4, CGg1–Cg4, CGh1–CGh4, and CGi1–CGi4), source-side selecting gates SGS (SGSd, SGSe, SGSf, SGSg, SGSh, and SGSi), drain-side selecting gates SGD (SGDd, SGDe, SGDf, SGDg, SGDh, and SGDi), bit lines BL (BLj, BLk, and BL1), data latch circuits DL (DLj, DLk, and DL1), control-gate/selecting-gate driver circuits DRY (DRVd, DRVe, DRVf, DRVg, DRVh, and DRVi), block-address latch circuits BAL (BALd, BALe, BALf, BALg, BALh, and BALi), memory cells MC (MCd4j, MCd4k, MCd4l, MCf4j, MDf4k, MDf4l, MCd4j, MCg4k, and MCg4l), column selecting lines CSL (CSLj, CSLk, and CSLe), input/output lines I/O and $\overline{I/O}$, and a row decoder R/D. As shown in FIG. 3B, the row decoder R/D is connected to receive a row address RA.

The NAND-cell type EEPROM, i.e., the second embodiment of the invention, has a plurality of NAND-cell unit cells, each including four memory cells which are connected in series. Each NAND-cell unit is connected at one end to a bit line BL by a drain-side selecting gate SGD, and at the other end to, for example, the ground by a source-side selecting gate SGS. The data latch circuits DL are connected to the bit lines BL in one-to-one relation. Four control gate lines CG, connected to the four memory cells MC of any NAND-cell unit, are connected to one control-gate/selecting-gate driver circuit DRY. The driver circuit DRV is connected to one block-address latch circuit BAL and controlled by the circuit BAL. The circuit BAL is in turn connected to the row decoder R/D and controlled by the row decoder R/D.

The EEPROM shown in FIGS. 3A and 3B is operated in the same way as the conventional semiconductor memory device to achieve ordinary data-writing. Thus, how it performs the ordinary data-writing will not be described. Instead, special data-writing, wherein one-page data is copied onto a plurality of control gates at the same time, will be described with reference to FIGS. 4A and 4B. FIGS. 4A and 4B are a timing chart showing the waveforms of the signals which are used to write data into the memory device by means of multiplex control-gate-line selection. These figures overlap in part, for facilitating the understanding of the special data-writing.

Shown in the timing chart of FIGS. 4A and 4B are command-latch enable signal CLE, an address-latch enable signal ALE, a chip enable signal $\overline{CE}$, a write enable signal $\overline{WE}$, and a read enable signal $\overline{RE}$. These are control signals externally input. Also shown in the timing chart is a flag signal Read/Busy used for indicating the operating state of the memory device or chip to the outside.

First, a command signal COM1 is input from the input/output lines I/O, instructing that data be written into the chip by means of multiplex control-gate-line selection. Then, three addresses RAd, RAf and RAg, which form a row address for achieving the multiplex control-gate-line selection, are input into the chip from the input/output lines I/O and the block addresses thereof are subsequently stored into the block-address latch circuits BALd, BALf and BALg.

Each address may consist of ten bits, the upper eight of which form a block address, and the lower two of which constitute a NAND-cell unit address. The addresses RAd, RAf and RAg may be replaced by block addresses and NAND-cell unit addresses externally input. The NAND-cell unit addresses may be input either before or after the block addresses, so that address signals, each for selecting one of the memory cells forming a NAND-cell unit, are supplied to the control gate lines CG and the control-gate/selecting-gate driver circuit DRY.

According to the row addresses RAd, RAf and RAg, NAND-cell block addresses, and NAND-cell unit address are selected. Next, one-page data is written into the data latch circuit DL. The one-page data consists of 264 bytes, including eight bytes for correcting errors in the example of FIGS. 4A and 4B. The one-page data is input from the input/output lines I/O, like the command signal COM1 and the addresses RAd, RAf and RAg. Alternatively, the one-page data may be input via input/output lines other than the lines for inputting the addresses RAd, RAf and RAg.

Then, a write-start command COM2 is supplied to the chip. In response to the command COM2, a voltage booster circuit (not shown) incorporated in the chip generates a high voltage for writing data into memory cells MC. In order to write data on the bit lines BLj and BL1 and to keep the bit line BLk in data-erased state, the bit lines BLj and BL1 are charged to a low voltage (e.g., 0 V), and the bit line BLk is charged to an intermediate voltage Vm (e.g., 10 V). Each memory cell MC is considered to assume data-storing state while the threshold voltage of the transistor of the cell MC is in enhancement mode due to the electrons injected into the floating gate of the cell MC, and to assume data-erased state while the threshold voltage of the transistor is in depletion mode because the floating gate has been depleted of electrons.

Next, three NAND-cell blocks Bd, Bf and Bg are selected in accordance with data contained in the block-address latch circuits BAL. Assume that the NAND-cell unit addresses designate the fourth memory cell of each NAND-cell unit, the control gate lines CGd4, CGf4 and CGg4 of the three blocks are selected at the same time. A data-writing voltage, e.g., a high voltage Vpp of 20 V, is applied to the control gate lines CGd4, CGf4 and CGg4 thus selected.

Upon lapse of a predetermined time, when the data is completely written the control gate lines CGd4, CGf4 and CGg4 are set back to the low state. During the cycle of writing the data into the selected blocks, the control gate lines CGd1–CGd3, CGf1–CGf3 and CGg1–CGg3 not selected are charged to an intermediate voltage of, for example, 11 V. Also, the drain-side selecting gates SGDd, SGDf and SGDg are charged to the same intermediate voltage. This intermediate voltage may be 11 V, which is higher than the intermediate voltage (10 V) of the unselected bit lines in consideration of the threshold voltages of the drain-side selecting gates and the unselected control gates in the selected NAND-cell blocks. Nonetheless, the intermediate voltage may be of the same value as the intermediate voltage (10 V) of the unselected bit lines. While the data is being written, the source-side gates SGSd, SGDf and SGSg of the selected NAND-cell blocks, and the control gates and selecting gates of the unselected blocks remain at a low state, i.e., 0 V.

During the data-writing period tPROG (FIG. 4A), data-writing and verification data-reading may be effected alternately. If this is the case, two or more control gate lines CG are selected. More precisely, the control gate lines CGd4, CGf4 and CGg4 which have been selected during the data-writing are at the low state (0 V), whereas the other control gate lines CG, source-side gates and drain-side gates of the selected blocks set at a high state (Vcc). The potentials of the bit lines preliminarily charged to a predetermined potential are thereby changed based on the data stored in the selected memory cells, and the data stored in the selected memory cells is read onto the bit lines.

The data latch circuits DLj, DLk, and DLl may function as bit-line sense amplifier circuits, as well. Further, a circuit for performing the verification data-reading may be used, such that writing data in the data latch circuits is automatically rewritten, thereby to prevent data from being written, in the next data-writing cycle, into the memory cells into which other data has been written already.

When the data-writing cycle is finished and a command signal COM3 is supplied to the chip, it is indicated to the input/output lines I/O whether or not the data has been completely written. For example, it is "pass" when a line I/O indicates "0", while it is "fail" when the line I/O indicates "1".

As can be understood from FIGS. 3A and 3B, the block address latch circuits BAL are provided for the NAND-cell blocks, in one-to-one relationship. Alternatively, one address latch circuit may be provided for one control gate line CG.

The verification data-reading will be explained below in detail.

The verification data-reading is initiated after a write pulse having a prescribed width has been supplied to, e.g., the selected three control gate lines CGd4, CGf4 and CGg4, and checks whether the threshold voltage of each data-written memory cells reaches a predetermined value. In order to perform the check for the verification data-reading, verification data-reading circuits provided on the bit lines BL, respectively, are used. Data is stored into the data latch circuits which function as bit-line sense amplifier circuits, as well, so that the data may be written again into the memory cells. The verification data-reading is the same as ordinary data-reading, except that data is stored into the data latch circuits if the verification data-reading circuits find it necessary to write data again into the memory cells which are associated with the data latch circuits.

The control gate lines CGd4, CGf4 and CGg4 temporarily remain not selected after a write pulse having a prescribed width has been supplied and the bit lines BL are preliminarily charged. Then, the control gate lines CGd4, CGf4 and CGg4 are selected again. The potentials applied on the selected control gate lines CGd4, CGf4 and CGg4 differ from each other between data-writing and data-reading. The bit lines BLj and BL1 are set at a low state (e.g., 0 V) and the bit line BLk is charged to an intermediate voltage Vm (e.g., 10 V) in order to make the memory cells MC connected to the bit lines BLj and BL1 in data-storing state and to hold the memory cells MC connected to the bit line BLk in data-erased state, during a data-writing cycle preceding the verification data-reading.

Here it should be recalled that any memory cell is regarded as assuming the data-storing state while the threshold voltage of the transistor of the cell MC remains in enhancement mode due to the electrons injected into the floating gate of the cell MC, and as assuming the data-erased state while the threshold voltage of the transistor remains in depletion mode because the floating gate has been depleted of electrons. Thus, in the memory cell array shown in FIGS. 3A and 3B, the memory cells MCd4k, MCf4k and MCg4k assume the data-erased state.

Namely, data items have been read from the memory cells MCd4j, MCf4j and MCg4j onto the bit line BLj, and data items have been read from the memory cells MCd4l, MCf4l and MCg4l onto the bit line BL1.

In relation to a bit line for which data-rewriting is necessary by the data latch circuit and the verification data-reading circuit connected thereto, the data is stored in the data latch circuit, e.g., DLj and DL1. The bit lines BLj and BL1 are discharged from the preliminary charged level and recognized to need data-rewriting until data items are written into the memory cells MCd4j, MCf4j and MCg4j and the memory cells MCd4l, MCf4l and MCg4l.

Until data is written into the memory cells MCd4j, MCf4j and MCg4j which have been selected, the writing of data through the bit line LBj is not completed. Similarly, until data is written into the memory cells MCd4l, MCf4l and MCg4l which have been selected, the writing of data through the bit line LB1 is not completed.

FIG. 5 is a circuit diagram illustrating the row system incorporated in the core section of the NAND-cell type EEPROM shown in FIGS. 3A and 3B. As shown in FIG. 5, each driver DRV for driving the control gates and selecting gates of the memory cells MC is connected to the row decoder R/D by a voltage converter circuit VC and an address storage section ASS. In FIG. 5, "SGD" denotes a selecting gate signal on the drain side, "CG1," "CG2," "CG3" and "CG4" represent control gate signals, "SGS" designates a selecting gate signal on the source side, "Vuss" represents a selecting gate voltage, and "Vpp" denotes a high voltage for data-writing.

The address storage section ASS incorporates a block address latch circuit BAL. The output of the latch circuit BAL is connected to the voltage converter circuit VC by first and second transfer gates TG1 and TG2. The input of the first transfer gate TG1 is connected to a NAND circuit NAND1, the input of which is arranged to receive an output from the address latch circuit BAL and a read/write enable signal RWENABL. The input of the second transfer gate TG2 is connected directly to the address latch circuit BAL. The transfer gates TG1 and TG2 are controlled by two signals EW and EWB, such that one is turned on, while the other is turned off. Which transfer gate is turned on depends on the operating mode of the EEPROM, the data-reading mode, the data-writing mode or the data-erasing mode.

In FIG. 5, "BLALEP" and "BLALEN" denote reset signals of the address latch circuit BAL, "PBUSBS" designates a signal for reading out a block address.

When "1" is input to the row decoder R/D, the output from the address storage section ASS changes between "1" for the data-reading cycle and the data-writing cycle and "0" for the data-erasing cycle.

Figure 6:
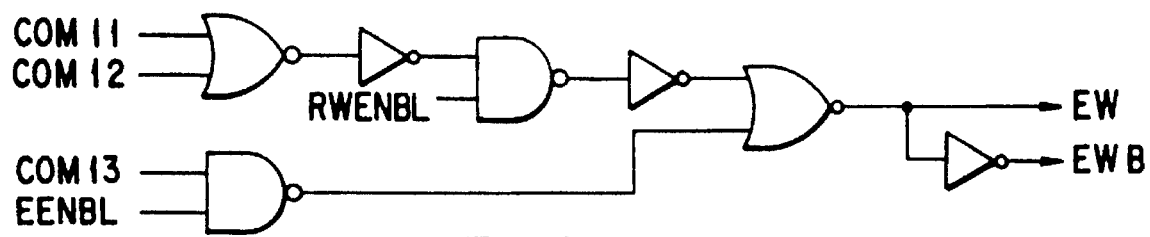
FIGS. 6 is a circuit diagram showing a logic gate circuit for generating control signals which are input to the transfer-gates of the address-storing section of the NAND-cell type EEPROM shown in FIGS. 3A and 3B.

The signals EW and EWB for controlling the the transfer gates TG1 and TG2, respectively, are generated by the logic gate circuit shown in FIG. 6. In FIG. 6, "COM11," "COM12" and "COM13" represent a data-writing command, a data-reading command, and a data-erasing command, respectively. "RWENABL" designates a read/write enable signal, and "EENBL" an erase enable signal. The commands and the signals are changed in their magnitudes as shown in FIGS. 7A, 7B and 7C, in order to write data, to read data and to erase data, respectively. To be more specific, the signals EW and EWB come to have magnitudes of "0" and "1," respectively, to write data or read data, and to have magnitudes of "1" and "0," respectively, to erase data. The first transfer gate TG1 and the second transfer gate GT2 are therefore on and off, respectively, during the data-writing or data-reading cycle, and are off and on, respectively, during the data-erasing cycle.

If "1" is input to the voltage converter circuit VC during the data-reading or -writing cycle, the transistors NHT1 and PHT1 incorporated are turned on. A high voltage Vpp is thereby applied to the n-type transistors of the transfer gates of the control-gate/selecting-gate driver circuit DRV, turning on these n-type transistors. Signal SGD, signals CG1 to CG4, and signal SGS can therefore be supplied to the control gate lines CG, respectively. If "0" is input to the voltage converter VC during the data-erasing cycle, the transistors NHT2 and PHT2 are turned on. A high voltage Vpp is thereby applied to the n-type transistors for grounding or Vuss-supplying of the driver circuit DRV, turning on these n-type transistors. The gate control lines CG are thereby set at a potential of 0 V.

Under the conditions set out above, the data-reading, data-writing and data-erasing can be carried out by setting the potentials of the necessary parts, as previously described.

Figure 8:
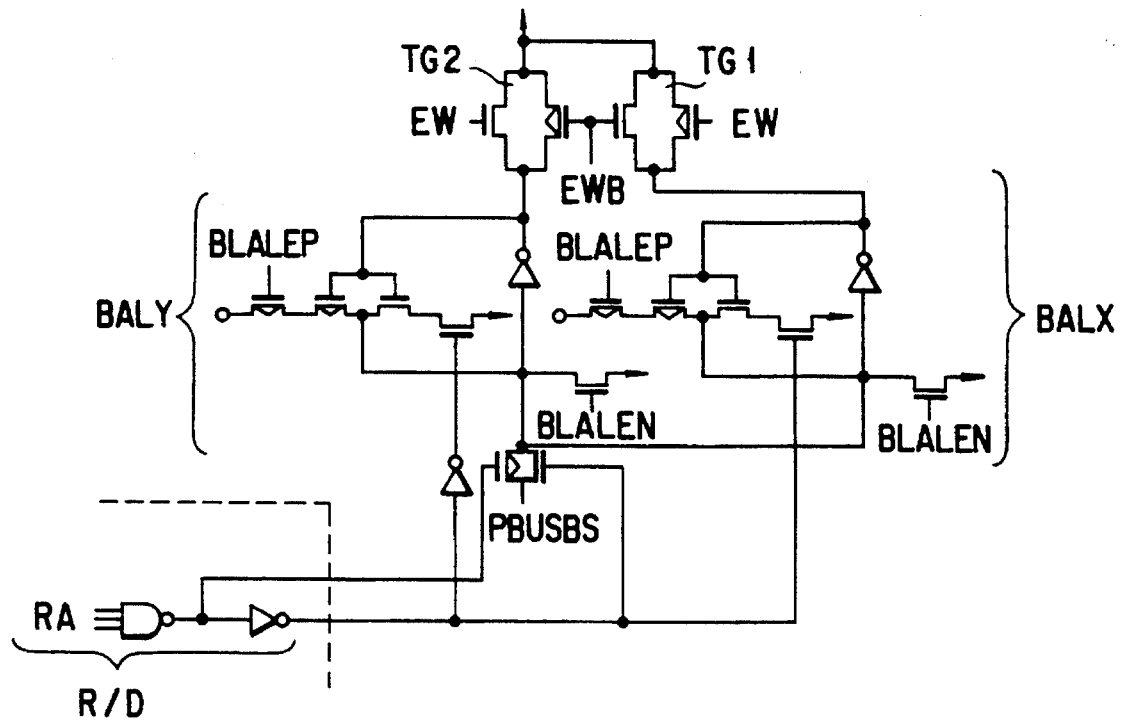
FIG. 8 is a circuit diagram showing a modification of the address-storing section of the NAND-cell type EEPROM shown in FIGS. 3A and 3B.

FIG. 8 is a circuit diagram showing a modification of the address-storing section of the NAND-cell type EEPROM shown in FIGS. 3A and 3B. The modified NAND-cell type EEPROM is characterized in that a block-address latch circuit BALX for data-writing is connected to the first transfer gate TG1, and a block-address latch circuit BALY for data-erasing is connected to the second transfer gate TG2. Hence, block-address latching can be achieved in both the data-writing cycle and the data-erasing cycle, and the output of the address storage section ASS can be switched between "1" and "0" during the data-writing cycle and the data-erasing cycle.

Figure 9:
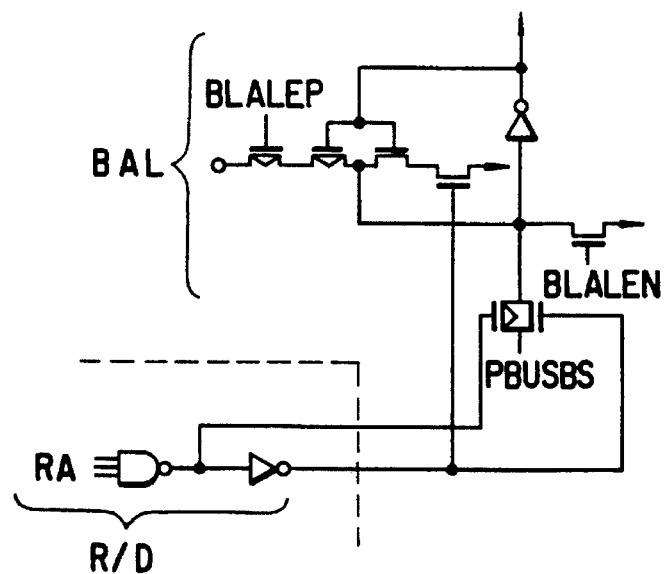
FIG. 9 is a circuit diagram illustrating another modification of the address-storing section of the NAND-cell type EEPROM shown in FIGS. 3A and 3B.

FIG. 9 is a circuit diagram illustrating another modification of the address-storing section of the EEPROM shown in FIGS. 3A and 3B. In this modified EEPROM, a block-address latch circuit BAL is used for both the data-writing and the data-erasing, as in the circuit illustrated in FIG. 5. This EEPROM is characterized in that the output of the address storage section ASS is "1" during both the data-reading cycle and the data-writing cycle, if "1" is input to the row decoder R/D. That is, the output of section ASS assumes a magnitude reverse to that of the section ASS incorporated in the circuit shown in FIG. 5 or FIG. 8. When 0 V as the signals CG1 to CG4 is sent to the control gate lines, the control gate lines of selected block to be subjected to data-erasing can be supplied with 0 V. In contrast, in relation to the control gate lines of unselected block not to be subjected to data-erasing, each transfer gate of the drive circuit DRV is closed. Therefore, when the potential of the p-well of memory cells is increased to Vpp, the control gate lines of the unselected block fall in a Vpp floating state (high floating state) due to capacitive coupling with the p-well.

Figure 10:
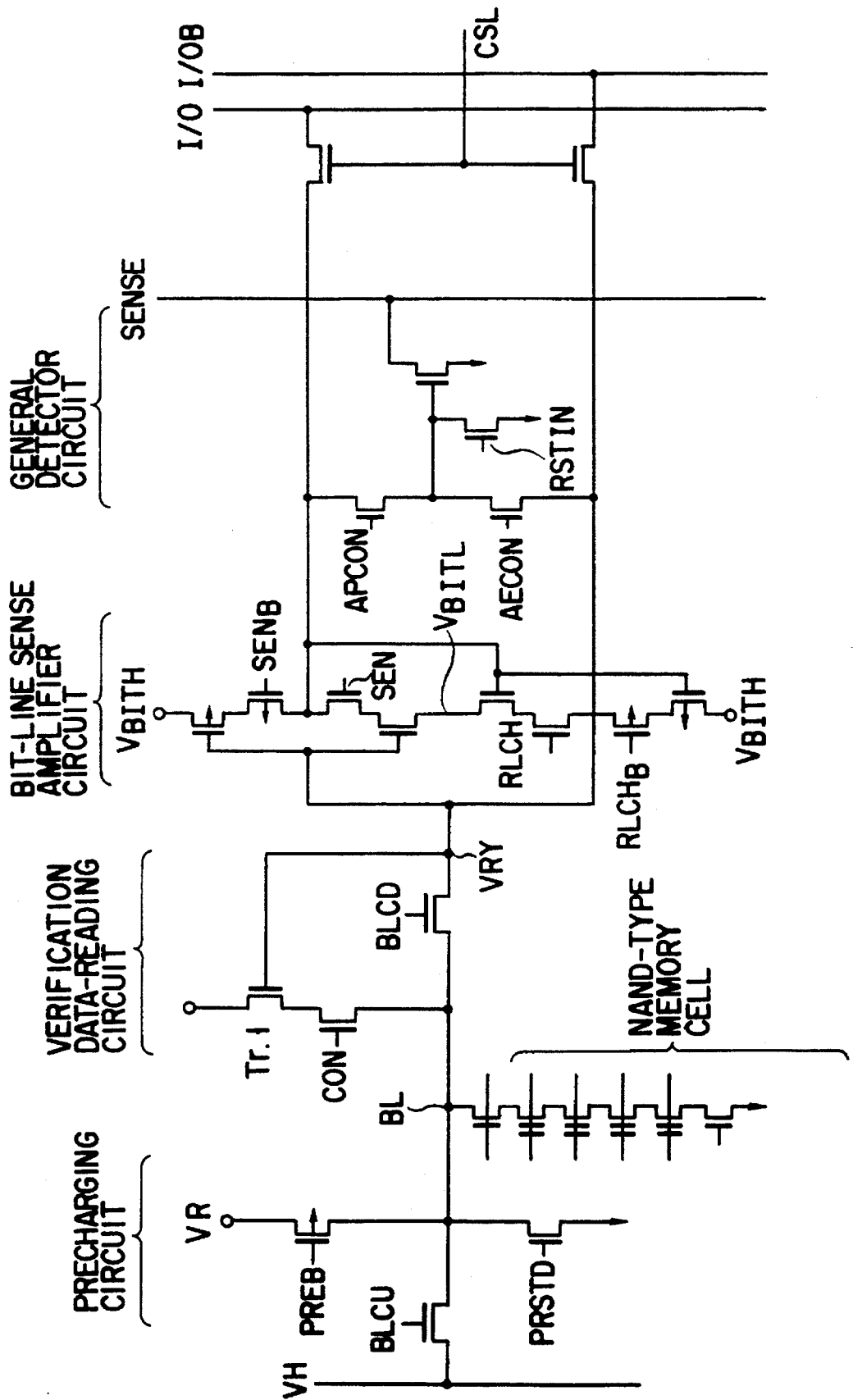
FIG. 10 is a circuit diagram showing a data latch circuit incorporated in the NAND-cell type EEPROM.
Figure 11:
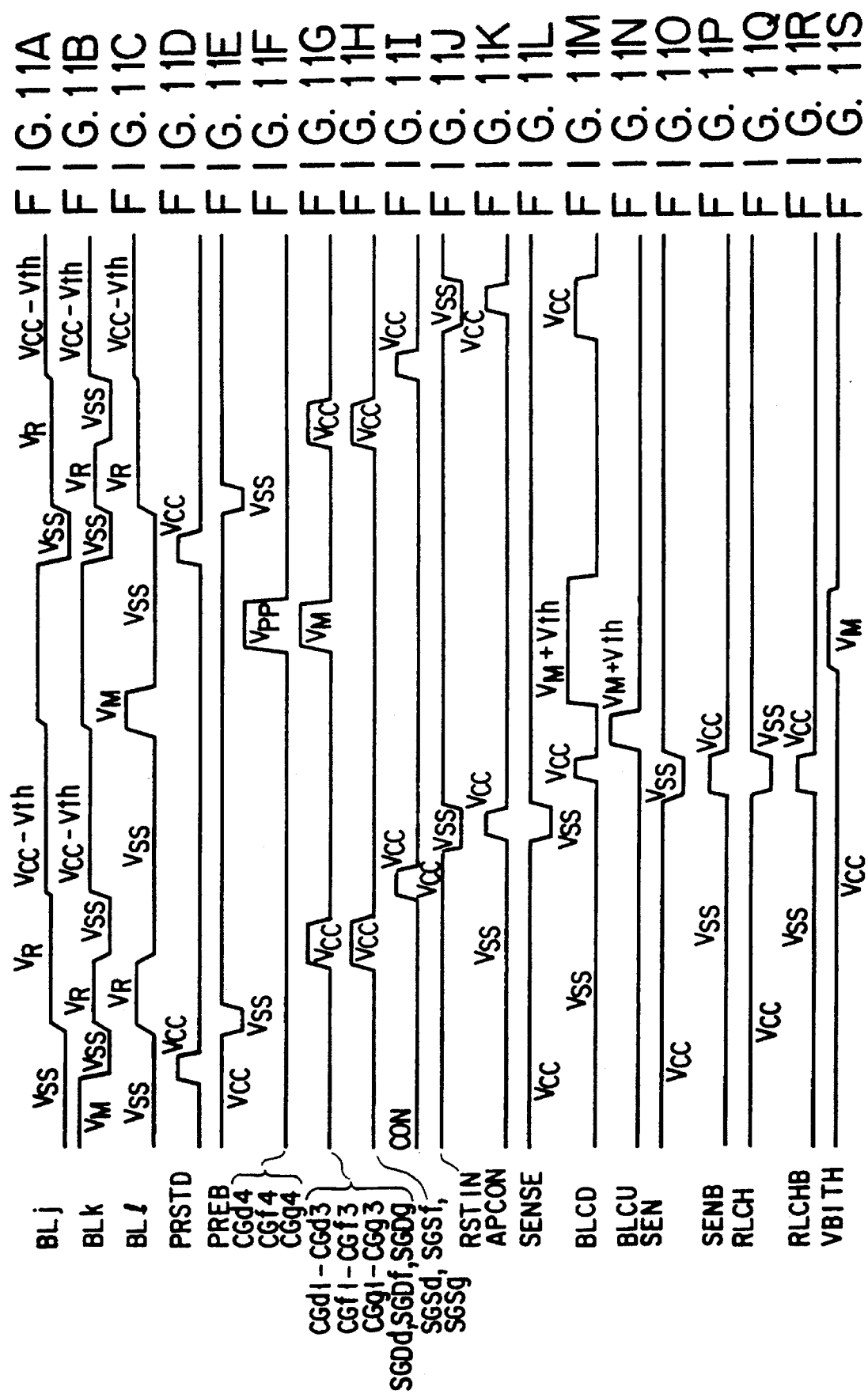
FIG. 11 is a timing chart for explaining when the major circuit nodes in the data latch circuit operate.

How the verification data-reading is carried out will now be explained in detail, with reference to FIGS. 10 and 11. FIG. 10 is a circuit diagram of one of the data latch circuits DL. FIG. 11 is a timing chart for explaining when the major circuit nodes in the data latch circuit operate;

As shown in FIG. 10, the data latch circuit DL includes a bit-line sense amplifier circuit, a verification data-reading circuit, a general detector circuit, and a precharging circuit. These components are of the types hitherto used in the conventional semiconductor memories, and do not characterize this invention.

At the start of the verification data-reading, a bit-line reset signal PRSTD rises from Vss to Vcc, resetting the bit line at Vss, as illustrated in FIG. 11. For example, the bit line BLk having data-erased state is reset from a write-inhibiting potential VM to Vss, whereas the bit lines BLj and BL1, both having data-written state, remain at Vss (0 V). Then, a bit-line precharge signal PREB falls from Vcc to Vss, whereby the bit lines BLj, BLk and BL1 are charged to a preliminary charging potential VR for data-reading.

Thereafter, the control gate lines CGd4, CGf4 and CGg4 which have been selected remain at Vss. In contrast, the potentials of the other control gate lines CGd1–CGd3, CGf1–CGf3 and CGf1–CGf3 of the same NAND-cell block, of the drain-side selecting gates SGDd, SGDf and SGDg, and of the source-side selecting gates SGSd, SGSf and SGSg rise from Vss to Vcc or a potential higher than Vcc. Any bit line for memory cells into which no data is written, and any bit line for memory cells into which data has been written but incompletely are thereby discharged from VR to Vss. If data has been fully written into, for example, the memory cells MCd4j, MCf4j and MCd4j, the bit line BLj will not be discharged and will remain at the preliminary charging potential VR.

Assume that data is not completely written into the memory cell MCd4l, one of the three selected cells MCd4l, MCf4l and MCg4l. Then, the bit line BL1 will be discharged from VR to Vss. Furthermore, the bit line BLk is also discharged from VR to Vss since no data is to be written into the memory cells connected to this bit line BLk.

Next, the control gate lines CGd–CGd3, CGf1–CGf3 and CGf1–CGf3 and the drain-side selecting gate lines SGDd, SGDf and SGDg and the source-side selecting gate lines SGSd, SGSf and SGSg are set back to Vss. Then, a comparison control signal CON rises from Vss to Vcc. The data written into the sense amplifier circuit is compared with the potential on the bit line after the verification data-reading. A data-writing node VRY (FIG. 10) is set at Vss with respect to the memory cells into which to write data. If the bit line BL1, for example, has been discharged to Vss, this means that data has not been completely written into at least one of the memory cells MCd4l, MDf4l and MCg4l, and that the threshold voltage of said at least one memory cell has not increased to a desired value. The bit line BL1 will therefore remain at Vss in the next data-writing cycle. The bit line BLj is not discharged at all since data has been fully written into the memory cells MCd4j, MCf4j and MCd4j which are connected to the bit line BLj.

In the next data-reading cycle, no data is written into the memory cells connected to the bit line BLj. Since the data-writing node VRY is set at Vss with respect to the memory cells MCd4k, MCf4k and MCg4k into which no data has been written from the beginning, the bit line BLk is charged again. Also, the bit line BLj is charged since data has been fully written into some of the memory cells connected to the bit line BLj. Both bit lines BLj and BLk are charged to Vcc-Vth, where Vth is the threshold voltage of one transistor (FIG. 10).

Then, a write control signal BLCD rises from Vss to Vcc, whereby the data on the bit line is the bit-line sense amplifier circuit. As a result, the data-writing node VRY is set at Vss with respect to the memory cells MCd4l, MCf4l and MCg4l which are connected to the bit line BL1 and into which data is to be written in the next data-writing cycle. Whether or not the data has been completely written is determined by the general detector. More specifically, a general-detection reset signal RSTIN falls from Vcc to Vss, whereby a general-detection control signal APCON rises from Vss to Vcc. The state of one-page writing is then conveyed to a general-detection read signal SENSE. If the signal SENSE falls from Vcc to Vss, it means that at least one data-writing node VRY is at Vss. In this case, the data-writing is continued. When all data-writing nodes VRY rise to Vcc, and the general-detection read signal SENSE no longer falls, the data-writing is terminated.

Assume data has not been completely written into, for example, the memory cell MCd4l. Then, data-writing is performed again for the bit line BL1. Verification data-reading is thereafter effected, determining that the data-writing has been completed with respect to the bit line BL1. In other words, the data-writing is terminated the moment the general-detecting read signal SENSE ceases to fall toward Vss.

Figure 12:
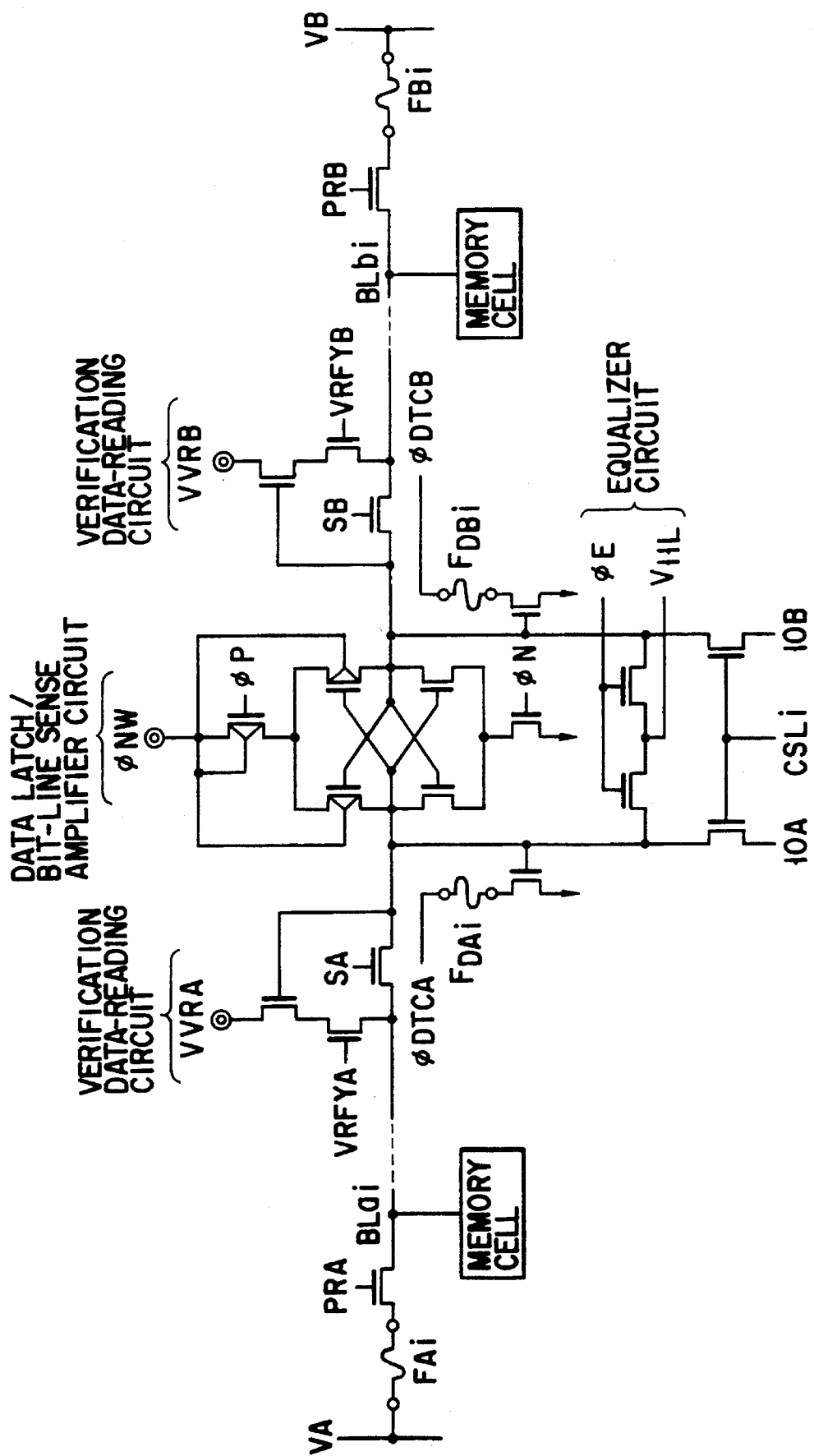
FIG. 12 is a circuit diagram of another type of a data latch circuit which can be used in the NAND-cell type EEPROM.

FIG. 12 is a circuit diagram of another type of a data latch circuit DL. This circuit DL functions as a bit-line sense amplifier circuit, too. It has two verification data-reading circuits. In the EEPROM shown in FIGS. 3A and 3B, each data latch circuit DL is connected to one end of a bit line. By contrast, the data latch circuit DL shown in FIG. 12 is connected to two bit lines BLai and BLbi.

Also in an EEPROM having data latch circuit DL of the type shown in FIG. 12, the multiplex control-gate-line selection can be achieved during any data-reading cycle. That is, two or more control gate lines CG can be selected simultaneously to write one-page data into a plurality of NAND-cell blocks at the same time. Therefore, the one-page data can be copied in the memory cell array, at higher speed than in the conventional semiconductor memory.

In the NAND-cell type EEPROM, the control gate lines of each NAND-cell block need not be selected sequentially from the one nearest to the cell source of the NAND-cell block, in order to write data into the NAND-cell block. Stated another way, the control gate lines can be selected at random, so as to write data into the memory cells driven by any control gate line thus selected. To write data into, for example, the NAND-cell block Bg, the control gate lines CGg1, CGg2, CGg3 and CGg4 may be selected in whichever order possible. That is, the lines CGg1, CGg2, CGg3 and CGg4 may be selected in the order mentioned; the liens CGg4, CGg3, CGg2 and CGg1 may be selected in the order mentioned; or the lines CGg4, CGg2, CGg1 and CGg3 may be selected in the order mentioned.

In order to write data first into the memory cell close to the bit-line contact, and then into the memory cell remoter from the bit-line contact, the transistor constituting the memory cell closest to the bit-line contact serve as a passage of data. The transistor is turned on when a voltage equal to their threshold voltage increased as data is written into the memory cell is applied to the control gate line to which the transistor is connected. Data can be thereby written into the remoter memory cells.

According to the present invention it is possible to set in floating state the channel sections of the transistors forming NAND memory cells into which no data is to be written. If the channel sections of the transistors are set in the floating state, the memory cell is held in the data-erased state, in operation for the data-writing.

The present invention can be applied to not only a NAND-cell type EEPROM in which a plurality of memory cells are connected in series with common source and drain, but also a DINOR-cell type EEPROM and an AND-cell EEPROM in which a plurality of memory cells are connected in parallel to form a unit connected to a bit line.

Figure 13:
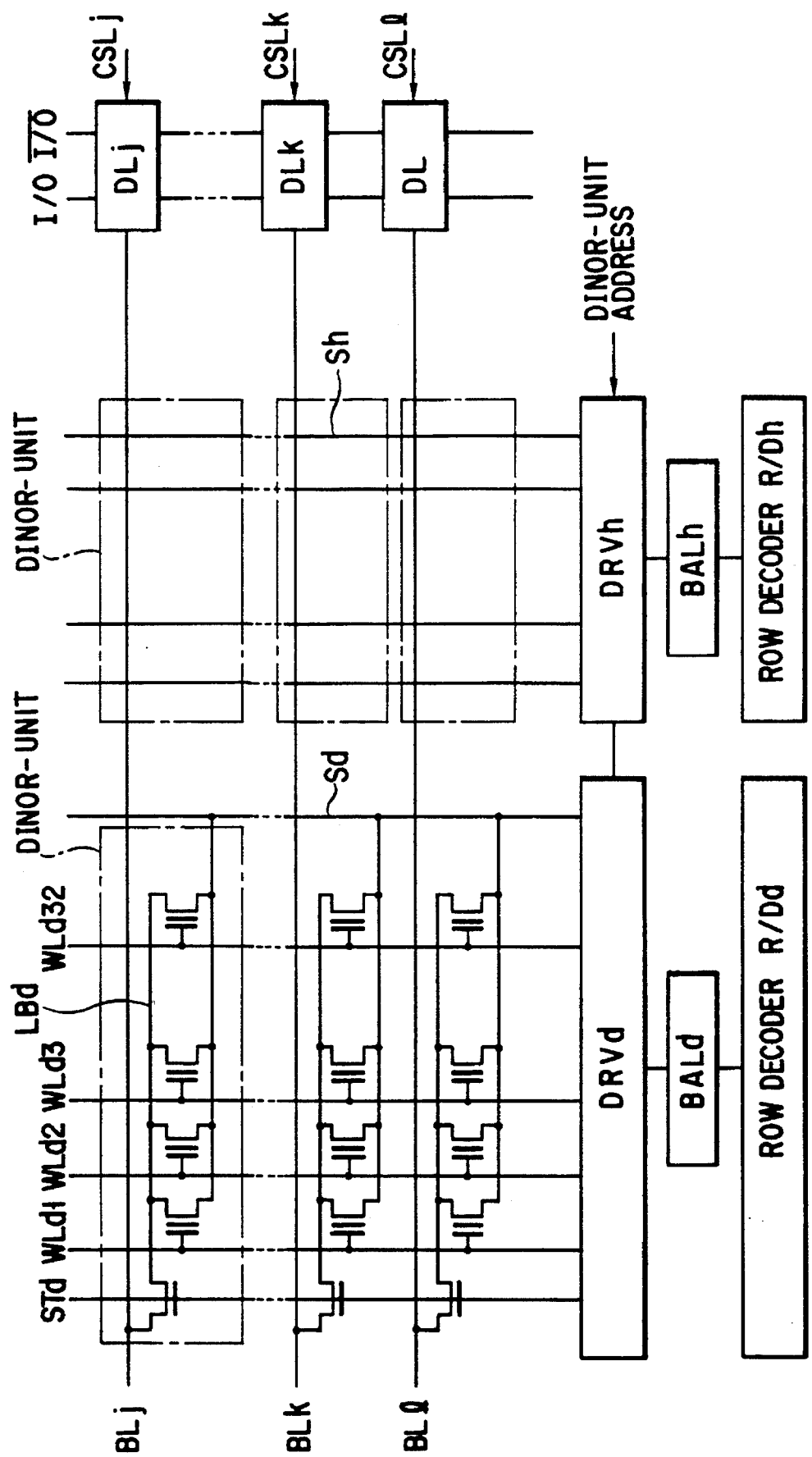
FIG. 13 is a block diagram showing the memory cell array incorporated in a DINOR-cell type EEPROM according to the third embodiment of the present invention.
Figure 14:
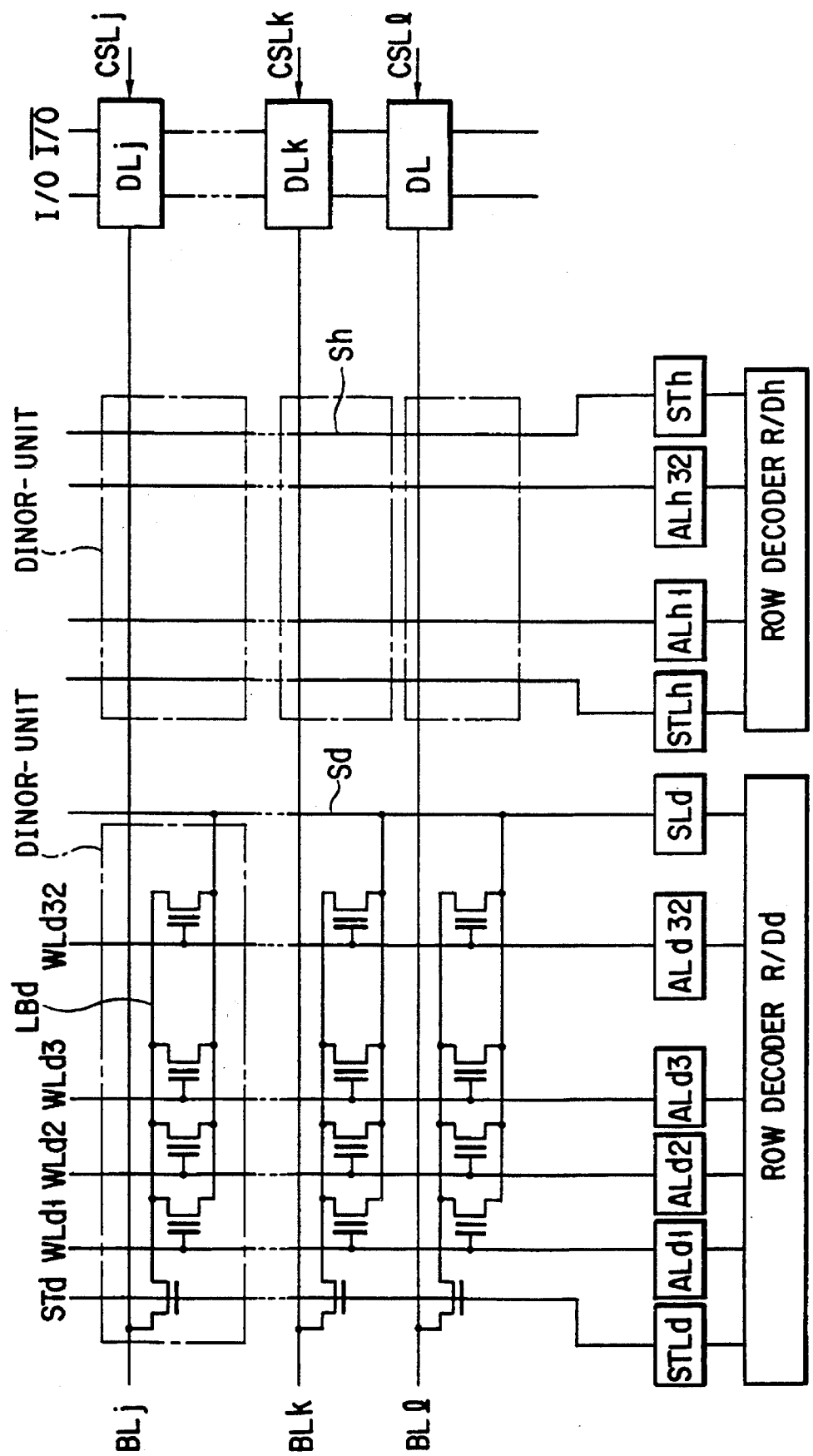
FIG. 14 is a block diagram showing the memory cell array incorporated in a DINOR-cell type EEPROM according to the fourth embodiment of the present invention.
Figure 15:
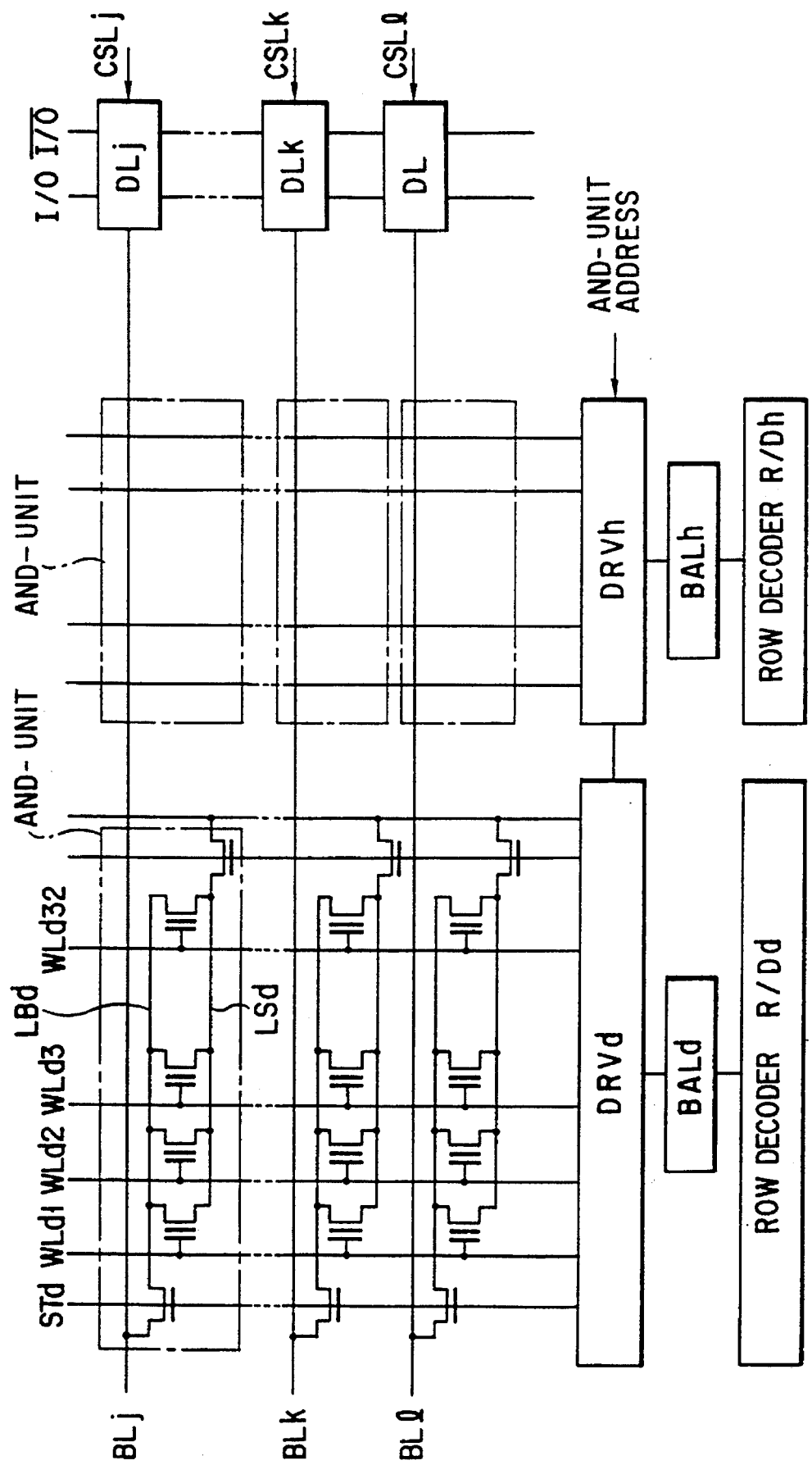
FIG. 15 is a block diagram showing the memory cell array incorporated in an AND-cell type EEPROM according to the fifth embodiment of the present invention.
Figure 16:
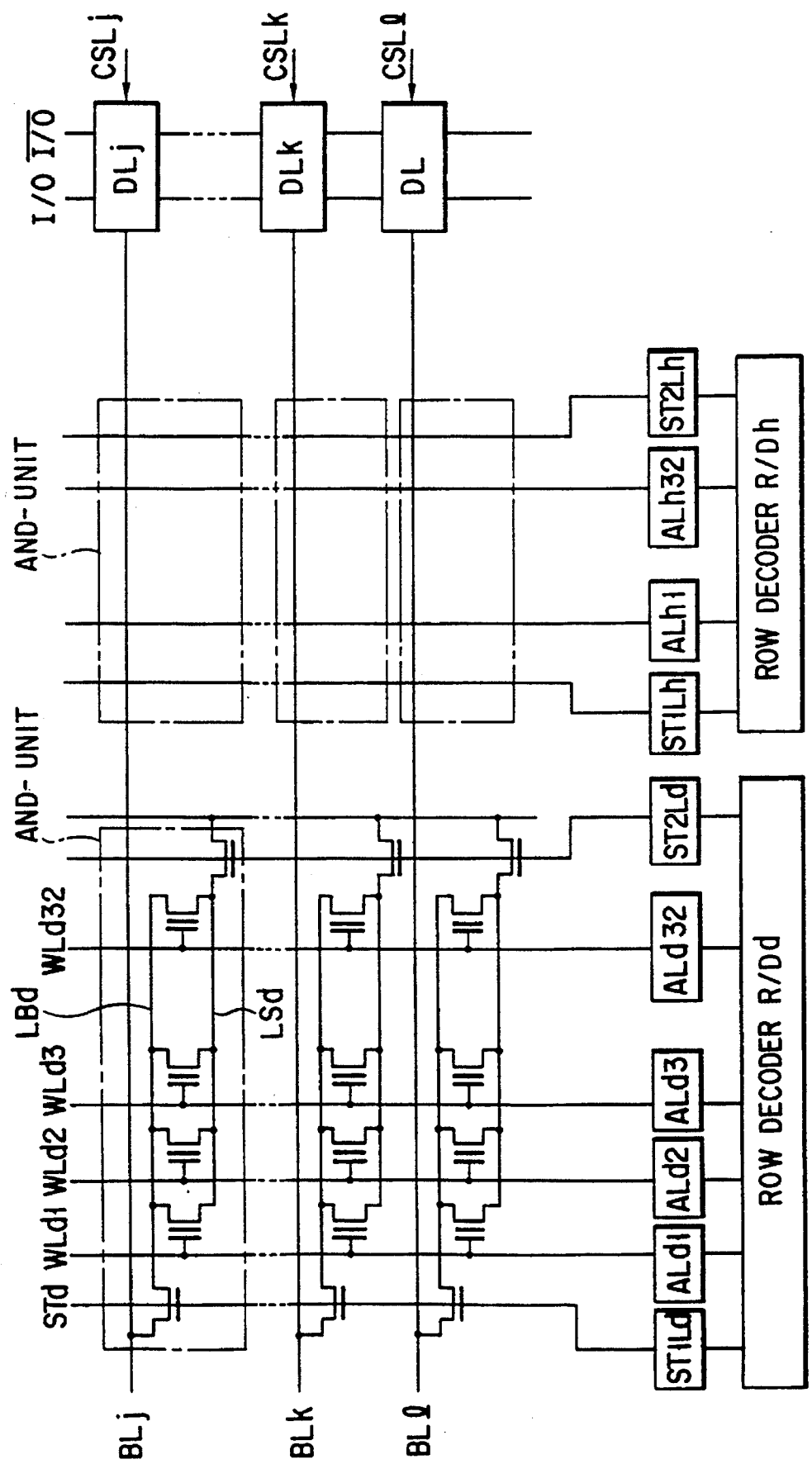
FIG. 16 is a block diagram showing the memory cell array incorporated in an AND-cell type EEPROM according to the sixth embodiment of the present invention.

FIGS. 13 and 14 show two types of DINOR-cell type EEPROM, respectively, according to other embodiments of the present invention. FIGS. 15 and 16 show two types of AND-cell type EEPROMs, respectively, according to still other embodiments of the present invention. These EEPROMs will be described below in detail.

The DINOR-cell type EEPROM shown in FIG. 13 comprises block-address latch circuits BALd to BALh, row decoders R/Dd to R/Dh, DINOR-cell units, and driver circuits DRVd to DRVh. Each block-address latch circuit BAL is connected between the associated row decoder R/D and the associated driver circuit DRV for driving the word lines, selecting line and source line of the associated DINOR-cell unit. The AND-cell type EEPROM shown in FIG. 15 comprises block-address latch circuits BALd to BALh, row decoders R/Dd to R/Dh, AND-cell units, and driver circuits DRVd to DRVh. Each block-address latch circuit BAL is connected between the associated row decoder R/D and the associated driver circuit DRY for driving the word lines and selecting line of the associated AND-cell unit. Hence, in the EEPROMs of FIGS. 13 and 15, the same data can be simultaneously written into two or more cell blocks through word lines selected, as in the NAND-cell EEPROM of FIGS. 3A and 3B which is the second embodiment of this invention.

The DINOR-cell type EEPROM of FIG. 14 comprises address latch/driver circuits STLd, ALd1 to ALd32 and SLd, row decoders R/Dd to R/Dh, and DINOR-cell units. Each address latch/driver circuit is connected between the associated row decoder R/D and the word lines, selecting lines and source line of the associated DINOR-cell unit. The AND-cell type EEPROM shown in FIG. 16 comprises address latch/driver circuits ST1L, ALd1 to ADd32 and ST2Ld, row decoders R/Dd to R/Dh, and AND-cell units. Each address latch/driver circuit is connected between the associated row decoder R/D and the word lines and selecting line of the associated AND-cell unit. In the EEPROMs of FIGS. 14 and 16, the same data can be simultaneously written through word lines selected, as in the semiconductor memory of FIG. 1 which is the first embodiment of the present invention.

As has been described, in the present invention, address data for selecting word lines, control gate lines or memory-cell blocks is temporarily stored in an address storage section which has latch circuits or block-address latch circuits. It is therefore possible to copy one-page data into a plurality of memory cells by means of multiplex control-gate-line selection, that is, by selecting a plurality of control gate lines at the same time. The one-page data can be copied in the memory cell array faster than in the conventional semiconductor memory. Thus, the present invention can provide a semiconductor memory device with which it is easy to accomplish management of data.

The present invention can be applied to a DRAM as well as nonvolatile memories. The peripheral circuits shown in FIGS. 10 and 11 may be changed in structure if necessary. Furthermore, various changes and modification can be made without departing the spirit and scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:

a plurality of bit lines;

a plurality of control gate lines intersecting with said bit lines;

a plurality of memory cells driven by applying a potential to said control gate lines for selectively storing data, supplying data to said bit lines and receiving data therefrom, said memory cells forming a plurality of cell units each comprising a plurality of memory cells selected from said memory cells and connected to one bit line via a common selecting gate transistor;

a plurality of data latch circuits provided on said bit lines, respectively, for storing data to be written into the memory cells selected by said control gate lines;

a plurality of selecting gate drivers provided to correspond to said cell units, respectively, for driving the control gate lines of the memory cells of each cell unit;

a row decoder for decoding row addresses for driving said selecting gate drivers and said control gate lines; and a plurality of block-address latch circuits provided to correspond to said selecting gate drivers, respectively, for temporarily storing signals derived from a row address by said row decoder, thereby to select at least two of said selecting gate drivers at the same time in order to write data.

2. The memory device according to claim 1, wherein the memory cells of each cell unit are connected in series with respect to the associated bit line.

3. The memory device according to claim 1, wherein the memory cells of each cell unit are connected in parallel with respect to the associated bit line.

4. The memory device according to claim 1, wherein the control gate lines of the memory cells of each cell unit are selected at random in order to write data.

5. The memory device according to claim 1, wherein said block-address latch circuit is able to select at least two of said selecting gate drivers at the same time in order to erase data.

6. The memory device according to claim 1, wherein first and second transfer gates are arranged in parallel for supplying an output of each block-address latch circuit to the associated selecting gate driver, opens and closes, respectively, in order to write data, and closes and opens, respectively, in order to erase data, the output of each block-address latch circuit is supplied to said first and second transfer gates in inverted and not inverted states, respectively.

7. The memory device according to claim 1, further comprising a plurality of additional block-address latch circuits provided to correspond to said selecting gate drivers, respectively, for selecting at least two of said selecting gate driver at the same time, in order to erase data.

8. The memory device according to claim 1, wherein each of said data latch circuits functions as a bit-line sense amplifier and a verification data-reading circuit to conduct a verification as to whether data has been written into the memory cells, and any of said control gate lines that has been selected to write data is again selected when the verification is conducted.

9. A semiconductor memory device comprising:

a plurality of bit lines;

a plurality of control gate lines intersecting with said bit lines;

a plurality of memory cells driven by applying a potential to said control gate lines for selectively storing data, supplying data to said bit lines and receiving data therefrom, said memory cells forming a plurality of cell units each comprising a plurality of memory cells selected from said memory cells and connected in series to one bit line via a common selecting gate transistor;

a plurality of data latch circuits provided on said bit lines, respectively, for storing data to be written into the memory cells selected by said control gate lines;

a plurality of selecting gate drivers provided to correspond to said cell units, respectively, for driving the control gate lines of the memory cells of each cell unit; and a row decoder for decoding row addresses for driving said selecting gate drivers and said control gate lines, wherein the control gate lines of the memory cells of each cell unit are selected at random in order to write data.

10. The memory device according to claim 9, further comprising a plurality of block-address latch circuits provided to correspond to said selecting gate drivers, respectively, for temporarily storing signals derived from a row address by said row decoder, thereby to select at least two of said selecting gate drivers at the same time in order to write data.

* * * * *